(12) United States Patent
Gregor et al.

(10) Patent No.: US 6,800,833 B2
(45) Date of Patent: Oct. 5, 2004

(54) ELECTROMAGNETICALLY LEVITATED SUBSTRATE SUPPORT

(76) Inventors: Mariusch Gregor, 4443 Valley Ave., Pleasanton, CA (US) 94566; Peter Reimer, 905 Golden Way, Los Altos, CA (US) 94024; Vincent Seidl, 1918 Lakeway Blvd., Austin, TX (US) 78734

(*) Notice: Subject to any disclaimer, the term of this patent is extended or adjusted under 35 U.S.C. 154(b) by 27 days.

(21) Appl. No.: 10/114,014

(22) Filed: Mar. 29, 2002

(65) Prior Publication Data

US 2003/0183611 A1 Oct. 2, 2003

(51) Int. Cl.[7] .................................................. F27B 5/14
(52) U.S. Cl. ..................... 219/390; 219/405; 219/411; 392/416; 392/418; 310/90.5; 310/86; 310/261; 118/730; 118/715; 118/725
(58) Field of Search .................................. 219/390, 405, 219/411; 392/416, 418; 310/90.5, 86, 1, 261; 118/730, 715, 125

(56) References Cited

U.S. PATENT DOCUMENTS

| | | | |
|---|---|---|---|
| 5,270,600 A | 12/1993 | Hashimoto | 310/75 D |
| 5,524,502 A | * 6/1996 | Osanai | 74/490.07 |
| 5,641,054 A | 6/1997 | Mori et al. | 198/619 |
| 5,818,137 A | * 10/1998 | Nichols et al. | 310/90.5 |
| 5,871,588 A | * 2/1999 | Moslehi et al. | 118/730 |
| 5,916,366 A | * 6/1999 | Ueyama et al. | 118/52 |
| 6,049,148 A | 4/2000 | Nichols et al. | 310/68 B |
| 6,136,163 A | 10/2000 | Cheung et al. | 204/198 |
| 6,144,118 A | 11/2000 | Cahill et al. | 310/12 |
| 6,157,106 A | * 12/2000 | Tietz et al. | 310/90.5 |
| 6,181,040 B1 | 1/2001 | Schöb | 310/90.5 |
| 6,255,795 B1 | 7/2001 | Ebihara et al. | 318/649 |
| 6,255,796 B1 | 7/2001 | Ebihara et al. | 318/649 |
| 6,283,041 B1 | * 9/2001 | Ono | 108/20 |
| 6,323,935 B1 | 11/2001 | Ebihara et al. | 355/53 |

* cited by examiner

*Primary Examiner*—Shawntina T. Fuqua
(74) *Attorney, Agent, or Firm*—Moser Patterson Sheridan LLC.; Peter J. Sgarbossa (57) ABSTRACT

An apparatus for supporting a substrate and a method for positioning a substrate include a substrate support, a stator circumscribing the substrate support, and an actuator. The actuator is coupled to the stator and adapted to change the elevation of the stator and/or adjust an angular orientation of the stator relative to its central axis. As the substrate support is magnetically coupled to the stator, a position, i.e., elevation and angular orientation, of the substrate support may be controlled.

27 Claims, 6 Drawing Sheets

ELECTROMAGNETICALLY LEVITATED SUBSTRATE SUPPORT

BACKGROUND OF THE INVENTION

1. Field of the Invention

Embodiments of the invention generally relate to an electromagnetically levitated substrate support.

2. Background of the Related Art

Integrated circuits have evolved into complex devices that can include millions of transistors, capacitors and resistors on a single chip. The evolution of chip design continually requires faster circuitry and greater circuit density that demand increasingly precise fabrication processes. One fabrication process frequently used is ion implantation.

Ion implantation is particularly important in forming transistor structures on semiconductors and may be used many times during chip fabrication. During ion implantation, silicon substrates are bombarded by a beam of electrically charged ions, commonly called dopants. Implantation changes the properties of the material in which the dopants are implanted to achieve a particular level of electrical performance. Dopant concentration is determined by controlling the number of ions in a beam of energy projected on the substrate and the number of times the substrate passes through the beam. The energy level of the beam typically determines the depth at which the dopants are placed. These dopants are accelerated to an energy level that will permit the dopants to penetrate or implant into the film at a desired depth.

During ion implantation, the implanted film often develops a high level of internal stress. In order to relieve the stress and further control the resulting properties of the implanted film, the film is typically subjected to a thermal process, such as annealing. Post-ion implantation annealing is typically performed in a rapid thermal processing (RTP) chamber that subjects the substrate to a very brief, yet highly controlled thermal cycle that can heat the substrate from room temperature to over 1000° C. in under 10 seconds. RTP relieves the stress induced during implantation and can be used to further modify film properties such as changing the electrical characteristics of the film.

Generally, an RTP chamber includes a radiant heat source or lamp, a chamber body and a substrate support ring. The lamp is typically mounted to a top surface of the chamber body so that the radiant energy generated by the lamp impinges upon the substrate supported by the support ring within the chamber body. A quartz window is typically disposed in the top surface of the chamber body to facilitate the transfer of energy between the lamp and the substrate. The support ring is typically comprised of silicon carbide and extends from a bottom of the chamber body to support the substrate by its outer edge. An external motor is used to rotate the substrate and the support ring to compensate for variations in the radiant energy generated by the lamp impinging across the substrate surface that could heat the substrate non-uniformly. Typically, the RTP process is performed at a reduced pressure to minimize potential particle and chemical contamination of the substrate.

U.S. Pat. No. 5,818,137, issued Oct. 6, 1998 to Nichols et al., describes an RTP chamber that is adapted to reduce particle contamination. Nichols, et al. describes a rotary motor and magnetic bearing that levitates a substrate supported within an RTP chamber, thus eliminating a bearing that conventionally supports the substrate support, thus removing a potential source of substrate contamination and particle generation. Generally, a stator assembly is coupled to the exterior of the RTP chamber and is magnetically coupled to a rotor. The rotor is coupled to the substrate support. When energized, the stator assembly levitates and passively centers the rotor along a vertical axis.

However, the Nichols et al. device requires precise control of stator energization in order to levitate the rotor and substrate support. A controller is coupled to a plurality of sensors to provide rotor positional information. The information is utilized by the controller to energize various control coils wound on each stator pole in response to the sensed physical position of the rotor. The chamber hardware and software required to provide such precise control is costly and subject to error which may result in damage to the substrate or poor processing results.

Moreover, mounting of the stator to the chamber body requires high precision to ensure the parallelism between the heating lamp and the substrate supported on the ring in order to minimize deviations in radial energy transferred across the diameter of the substrate. The careful fabrication and close tolerances needed to achieve good parallelism results in high system costs. Furthermore, it is desirable to eliminate other moving parts, such as lift pins, to further reduce particulate generation and system complexity.

Therefore, is a need for an improved substrate support.

SUMMARY OF THE INVENTION

An apparatus for supporting a substrate and a method for positioning a substrate are generally provided. In one embodiment, an apparatus for supporting a substrate includes a substrate support, a stator circumscribing the substrate support, and an actuator. The actuator is coupled to the stator and adapted to control the elevation of the stator and/or adjust an angular orientation of the stator relative to its central axis. As the substrate support is magnetically coupled to the stator, particle generating contact between the substrate support and other components is avoided while the elevation and angular orientation of a substrate disposed on the substrate support may be advantageously controlled.

In another embodiment, a processing chamber is provided. The processing chamber generally includes a chamber body having a substrate support disposed therein and a stator circumscribing the chamber body. The stator is magnetically coupled to the substrate support. An actuator is coupled to the stator and adapted to control the elevation and/or angular orientation of the stator.

In another embodiment, a method for positioning a substrate is provided. The method includes positioning a substrate supported on a robot blade above a magnetically levitating substrate support and elevating a stator magnetically coupled to the substrate support to lift the substrate from the blade.

In another embodiment, a method for positioning a substrate includes providing a substrate seated on a substrate support, and moving a stator magnetically coupled to the substrate support, thus controlling the elevation and/or orientation of the substrate support.

In another embodiment, a method for supporting a substrate includes providing a substrate support disposed in a process chamber, magnetically levitating the substrate support, and moving a stator along a central axis of the process chamber to control the elevation and/or orientation of the substrate support magnetically coupled thereto.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
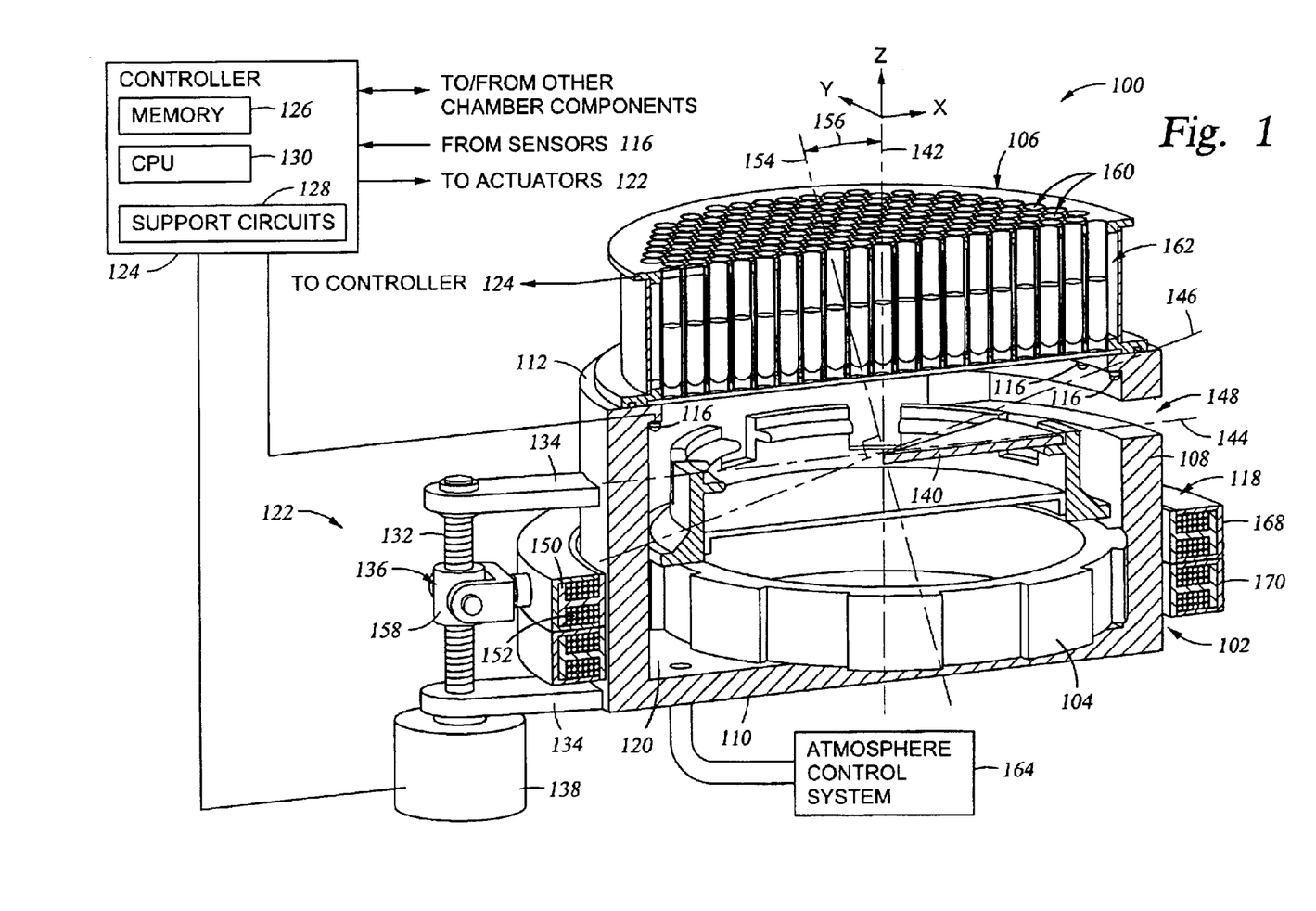
FIG. 1 is a sectional view of one embodiment of a processing chamber.

FIG. 1 depicts a simplified sectional view of one embodiment of a rapid thermal processing chamber 100 having a contactless substrate support 104 disposed therein. Examples of rapid thermal processing chambers that may be adapted to benefit from the invention are XEplus and Radiance CENTURA® thermal processing systems, both available from Applied Materials, Inc., located in Santa Clara, Calif. Although the contactless substrate support 104 is described as utilized within a rapid thermal processing chamber 100, the contactless substrate support 104 may be utilized in other substrate processing systems and ancillary devices such as substrate support platforms adapted for robot handoffs, orientation devices, deposition chamber, etch chambers, electrochemical processing apparatus and chemical mechanical polishing devices, among others, particularly where the minimization of particulate generation is desired.

The processing chamber 100 includes a chamber body 102 having walls 108, a bottom 110 and a top 112 defining an interior volume 120. The walls 108 typically include at least one substrate access port 148 to facilitate entry and egress of a substrate 140 (a portion of which is shown in FIG. 1). The top 112 includes a quartz window 114 through which a lamp assembly 106 mounted to the top 112 of the chamber body 102 may heat the substrate 140.

The lamp assembly 106 includes a plurality of honeycomb tubes 160 in a water jacket assembly 162. Each tube 160 contains a reflector and a tungsten halogen lamp assembly from which is formed a honeycomb-like pipe arrangement. This close-packed hexagonal arrangement of like pipes provides radiant energy sources with high-power density and good special resolution. In one embodiment, the lamp assembly 106 provides sufficient radiant energy to thermally process the substrate, for example, annealing a silicon layer disposed on the substrate 140. One lamp assembly that may be adapted to benefit from the invention is described in U.S. Pat. No. 5,487,127, issued Jan. 23, 1996 to Gronet, et al., and is hereby incorporated by reference in its entirety.

One or more sensors 116 are additionally coupled to the chamber body 102 proximate the top 112. Generally, the sensors 116 are adapted to detect the elevation of the substrate support 104 (or substrate 140) within the interior volume 120 of the chamber body 102. In the embodiment depicted in FIG. 1, the sensors 116 are coupled to the top 112 of the chamber body 102 radially outward of the window 114. The sensors 116 are adapted to provide an output indicative of the distance between the substrate support 104 and the top 112 of the chamber body 102. The sensors 116 may be ultrasonic, laser, inductive, capacitive or other type of sensor capable of detecting the proximity of the substrate 104 to the top 112 of the chamber body 102. In the embodiment depicted in FIG. 1, three sensors 116 are coupled to the top 112 of the chamber body 102 in a polar array about a central axis 142 of the chamber body 102.

A stator 118 circumscribes the walls 108 of the chamber body 102 and is coupled to one or more actuators 122 that control the elevation of the stator 118 along the exterior of the chamber body 102. The stator 118 is magnetically coupled to the substrate support 104 disposed within the interior volume 120 of the chamber body 102, creating a magnetic bearing assembly. Two stators that may be adapted to benefit from the invention are described in U.S. Pat. No. 5,049,148, issued Apr. 11, 2000 to Nichols, et al., and U.S. Pat. No. 5,818,137, issued Oct. 6, 1998 to Nichols et al., both of which are hereby incorporated by reference in their entireties.

In one embodiment, the stator 118 includes a drive coil assembly 168 stacked on a suspension coil assembly 170. The drive coil assembly 168 is adapted to rotate the substrate support 104 while the suspension coil assembly 170 is adapted to passively center the substrate support 104 within the processing chamber 100. Alternatively, the rotational and centering functions may be performed by a stator having a single coil assembly, for example, those stators available from Levitronics, located in Zurich, Switzerland.

A controller 124 is coupled to the sensors 116, actuators 122 and other elements of the processing chamber 100. The controller 124 utilizes the positional metric obtained from the sensors 116 to adjust the elevation of the stator 118 at each actuator 122 so that both the elevation and the planarity of the substrate support 104 and substrate 140 seated thereon may be adjusted relative to the lamp assembly 106 and central axis 142.

The controller 124 generally includes a central processing unit (CPU) 130, support circuits 128 and memory 126. The CPU 130 may be one of any form of computer processor that can be used in an industrial setting for controlling various actions and subprocessors. The memory 126 is coupled to the CPU 130. The memory 126, or computer-readable medium, may be one or more of readily available memory such as random access memory (RAM), read only memory (ROM), floppy disk, hard disk, or any other form of digital storage, local or remote. The support circuits 128 are coupled to the CPU 130 for supporting the controller 124 in a conventional manner. These circuits include cache, power supplies, clock circuits, input/output circuitry, subsystems, and the like.

An atmosphere control system 164 is also coupled to the interior volume 120 of the chamber body 102. The atmosphere control system 164 includes throttle valves and vacuum pumps for controlling chamber pressure. The atmosphere control system 164 may additionally include gas sources for providing process or other gases to the interior volume 120. Typically, atmosphere control system 164 provides process gases for thermal deposition procedures.

Figure 2:
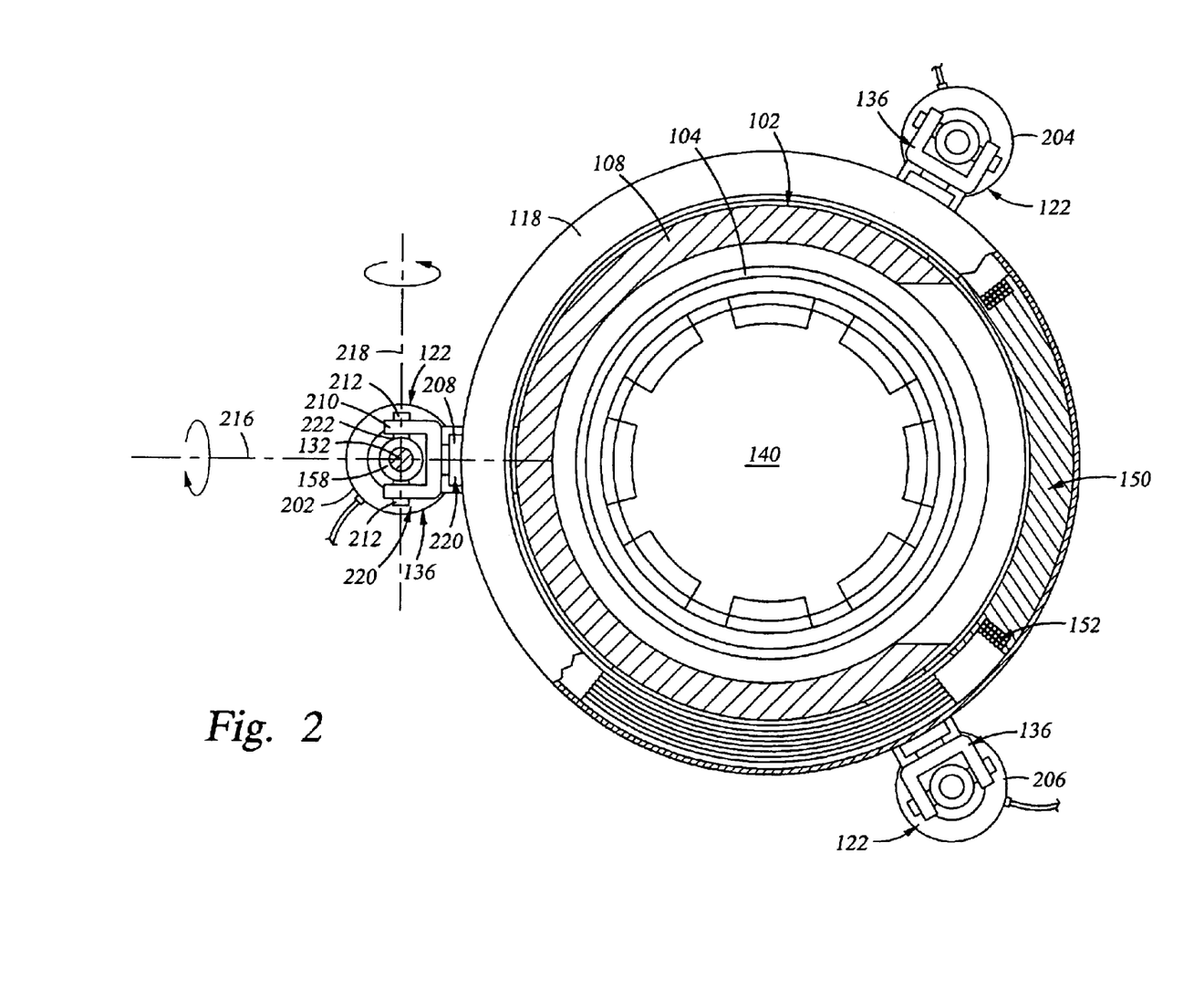
FIG. 2 is a sectional view of the processing chamber of FIG. 1.

FIG. 2 depicts a top sectional view of the processing chamber 100 of FIG. 1 illustrating the substrate support 104, the chamber body 102 and the stator 118 in cross section. The stator 118 is coupled to one or more actuators 122, identified as a first actuator 202, a second actuator 204 and a third actuator 206 in FIG. 2. In one mode of operation, the actuators 202, 204, 206 control the elevation of the stator 118 relative to the chamber body 102, which accordingly controls the elevation of the magnetically coupled substrate support 104 relative to the top 112 of the chamber body 102. Thus, the actuators 202, 204, 206, in response to the controller 140, can maintain or contactlessly move the substrate support 104 to a predetermined position using the actuators. Typically, the position of the support 104 is provided to the controller 140 by the sensors 116 as discussed above. In one embodiment, the actuators 202, 204, 206 are coupled to the stator 118 at about 120 degree intervals, although other angular orientations may be utilized.

In one alternative embodiment, the stator 118 may be solely coupled to the first actuator 204 to facilitate elevational control of the substrate support 104 in the axial direction. In embodiments where the first actuator 204 is utilized, the stator 118 should be supported in a manner that maintains an orientation of the stator 118 with respect to the central axis 142 during all modes of stator 118 movement and operation. This may be facilitated by appropriate bearings cooperating with the stator 118.

Referring to both FIGS. 1 and 2, the drive coil assembly 168 of the stator 118 includes a plurality of teeth 150 extending radially inwards toward the chamber walls 108. The teeth 150 are arranged in a polar array about the central axis 142 and formed a poles piece of the stator 118. Each tooth 150 supports a coil 152 coupled to the controller 124 that may be sequentially energized to polarize the drive coil assembly 168. As the coils 152 disposed on the teeth 150 of the drive coil assembly 168 are sequentially energized in alternating polarity, the magnetic attraction and repulsion of each tooth 150 to the substrate support 104 causes the substrate support 104 to rotate, thereby rotating the substrate 104 to ensure uniform heating during processing.

In another mode of operation, the actuators 202, 204, 206 may be selectively energized to cause a plane 144 of the stator 118 and substrate support 104 to be adjusted relative the central axis 142. As one actuator 122 is imparts a greater displacement of the stator 118 relative to another one of the actuators 122, the plane of the stator 118 and the substrate support 104 magnetically coupled thereto may be controlled or adjusted relative to the central axis 142 of the chamber body 102. As additional actuators 122 and/or sensors 116 are utilized, the resolution of adjustment increases along with a corresponding increase in the complexity of control.

A coupling 136 connects the actuators 202, 204, 206 to the stator 118. The coupling 136 has multiple degrees of freedom that facilitates changes in the orientation of the stator 118 without binding the actuators during movement of the stator 118. In one embodiment, the coupling 136 includes an arm 208 rotationally coupled to a yoke 210. The yoke 210 is coupled to the actuator 202 by a pair of pins 212. The arm and yoke joint 220 allows relative rotation between the first actuator 202 and stator 118 about a first axis 216. Typically, the first axis 216 is radially aligned with the central axis 142. The yoke and nut joint 222 allows relative motion between the first actuator 202 and stator 118 about a second axis 218 that is aligned with the pins 212. The second axis 218 is typically orientated perpendicular to the first axis 212. As the couplings 136 coupling the other actuators 204, 206 are similarly configured, the planar orientation of the stator 118 and substrate support 104 may be adjusted relative to the central axis 142 without binding any one of the actuators 202, 204, 206 during operation.

Optionally, the arm 208 or yoke 210 may be configured to provide motion along the first axis 218 (i.e., allow radial movement relative to the central axis 142) to prevent binding of the first actuator 202. For example, the arm 208 may be fabricated from an elastomeric material that allows the arm 208 to elongate when stressed. Additionally, an elastomeric arm 208 or yoke 210 would additionally provide some rotation about the second axis 218, thereby eliminating the need for a flexible arm to yoke joint 220.

Referring back to the FIG. 1, in one embodiment, each of the actuators 122 comprises a precision lead screw 132 coupled between two flanges 134 extending from the walls 108 of the chamber body 102. The lead screw 132 has a nut 158 that axially travels along the lead screw 132 as the screw rotates. The coupling 136 is coupled between the stator 118 and nut 132 so that as the lead screw 132 is rotated, the coupling 136 is moved along the lead screw 132 to control the elevation of the stator 118 at the interface with the coupling 136. Thus, as the lead screw 132 of one of the actuators 122 is rotated to produce relative displacement between the nuts 158 of the other actuators 122, the plane 144 of the stator 118 changes relative to the central axis 142.

In one embodiment, an electric control motor 138, such as a stepper or servo motor, is coupled to the lead screw 132 to provide controllable rotation in response to a signal by the controller 124. Alternatively, other types of actuators 122 may be utilized to control the linear position of the stator 118, such as pneumatic cylinders, hydraulic cylinders, ball screws, solenoids, linear actuators and cam followers, among others.

Generally, for purposes of illustration, the substrate support 104 and stator 118 are depicted as in plane 144 defining an XY plane with the central axis 142 of the stator 118 and substrate support 104 defining a Z axis. The actuators 122 may be uniformly energized (i.e., produce a uniform displacement of the stator 118) to move of the stator 118 along the Z axis. The displacement of the stator 118 along the Z axis produces a corresponding displacement of the substrate support 104 in the Z axis, with the plane 144 substrate support 104 remaining parallel to the reference XY plane. The sensors 116 or other sensing device provides the controller 124 with the substrate support's elevational information so that the substrate support 104 may be moved into a predetermined position relative the top 112 of the chamber body 102.

Alternatively, any one of the actuators (202, 204, 206 of FIG. 2) may be moved relative to another actuator, resulting in a change in orientation of the stator 118 and substrate support 104 to a plane 146 (shown in phantom in FIG. 1) non-parallel to the referenced XY plane 144, thus causing a central axis 154 (also shown in phantom in FIG. 1) of the substrate support 104 to become disposed at an acute angle 156 relative to the referenced Z axis. The magnitude of the angle 156 may be resolved utilizing at least three of the sensors 116 to provide the controller 124 with the relative distance between three points on the substrate support 104 and the top 112 of the chamber body 102. Typically, the angle 156 is corrected to about zero degrees to ensure that the substrate support 104 and the central axis 142 are substantially perpendicular thereby maintaining a uniform distance between the substrate 140 and lamp assembly 106 to enhance temperature uniformity across the substrate 140 during processing.

Independent of the planar orientation and elevational control of the stator 118 and substrate support 104, the controller 124 may provide a signal to the coils 152 of the stator 118 causing the coils to sequentially energize, thereby causing the substrate support 104 to rotate about its center line relative to the stator 118. As the substrate 140 rotates with the substrate support 104, temperature variations across the substrate 140 during processing are advantageously minimized.

Figure 3:
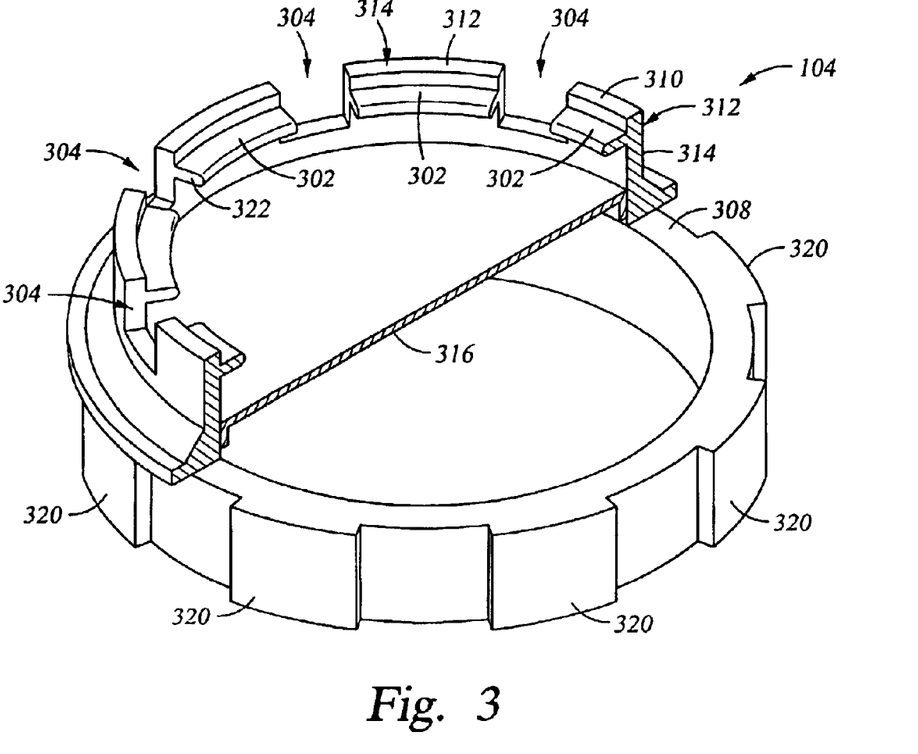
FIG. 3 is a sectional isometric view of one embodiment of a substrate support.

FIG. 3 depicts an isometric view of one embodiment of the substrate support 104. The substrate support 104 is defines an annular body and is at least partially comprised of a magnetic ring section 308 and a support section 312. The magnetic ring section 308 includes a plurality of radially extending flanges 320 that are comprised of a magnetic material, such as ferrous containing material, to facilitate magnetic coupling of the substrate support 104 to the stator 118. In one embodiment, the flanges 320 are comprised of a plurality of permanent magnets disposed in a polar array about the central axis 142.

The support section 312 coupled to the magnetic ring section 308 by fastening or bonding, and is adapted to support the substrate 140 during processing. The support section 312 may be fabricated from a material that reduces potential scratching, chemical or physical contamination and/or marring of the substrate, for example, silicon carbide, stainless steel, aluminum, ceramic or a high temperature polymer. Alternatively, the support section 312 may be fabricated as a unitary member from a magnetic material with the magnetic ring section 308.

The support section 312 comprises at least one support post 310 that projects from the magnetic ring section 308, defining the sides of a notch 304 that extends into the substrate support 104 to allow access to the underside of the substrate by a blade of a robot during substrate transfer. In the embodiment depicted in FIG. 3, a plurality of support posts 310 are spaced about the substrate support 104 in a polar array, defining a plurality of notches 304 therebetween. The support section 312 may include an optional support section body 314 that couples the posts 310 to the magnetic ring section 308.

The support posts 310 include an inwardly directed flange 322. The flange 322 includes a support surface 302 on which the substrate 140 is seated. Embodiments of the posts 310 may have different geometric configurations, for example, cylindrical or ring segments. A partially circumferential lip 314 extends coaxially from the support surface 302 to retain the substrate laterally on the substrate posts 310. The notch 304 is configured to allow a blade of a robot to pass through the lip 314 between the substrate 104 and magnetic ring section 308 as further described below.

In one embodiment, a thermally reflective plate 316 is coupled to the interior of the substrate support 104. The plate 316 reflects heat radiated from the substrate 140 back to the substrate for more efficient heating and temperature control for the substrate.

Figure 4A:
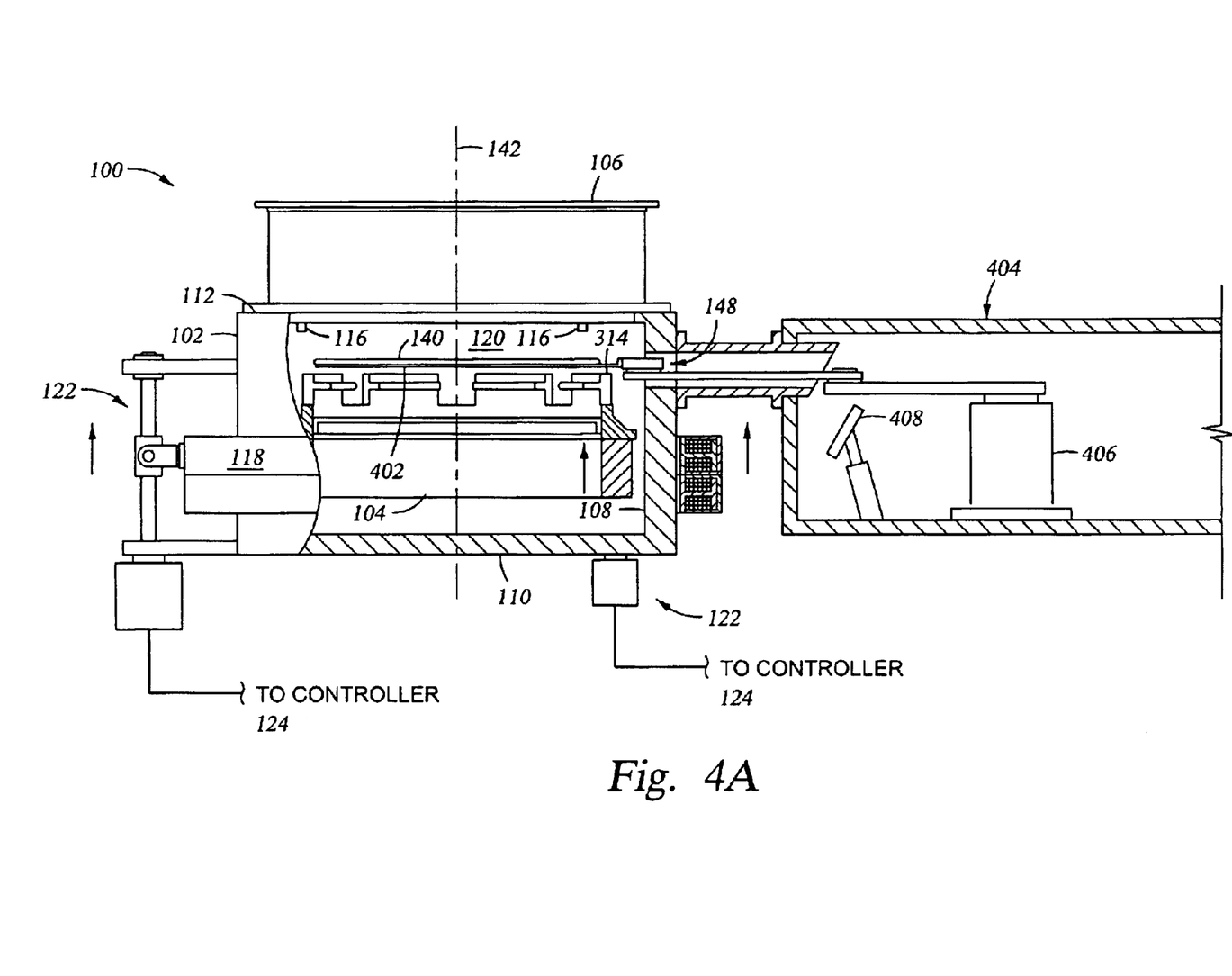
FIGS. 4A–B are sectional views of the processing chamber of FIG. 1.
Figure 4B:
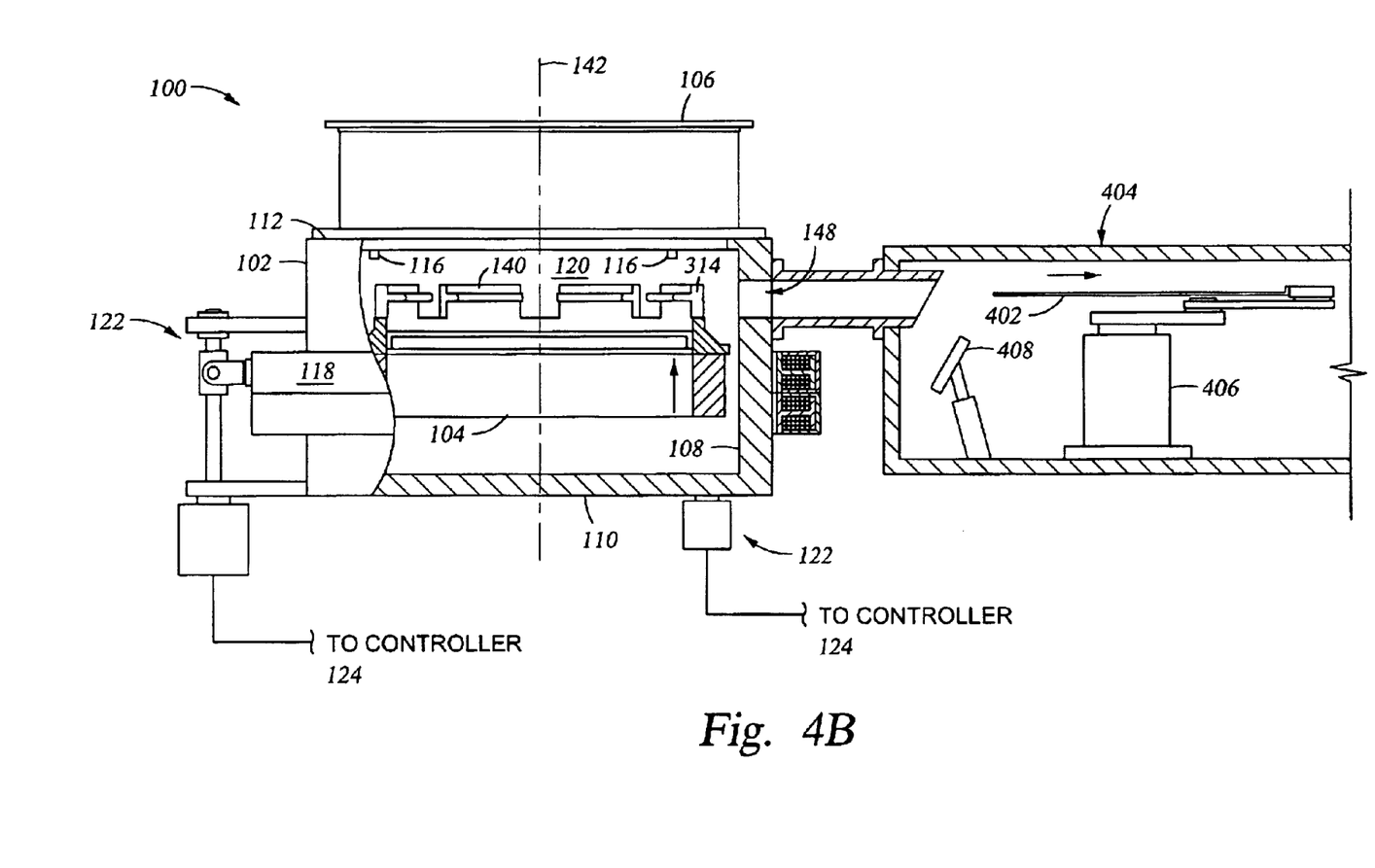

FIGS. 4A–B depict the processing chamber 100 coupled to a transfer chamber 404 having a transfer robot 406 disposed therein. Referring first to FIG. 4A, a blade 402 of the transfer robot 406 is depicted transferring the substrate 140 into the interior volume 120 of the chamber body 102 through the access port 148 disposed in the wall 108. One of the notches 304 is positioned adjacent the access port 148 to allow the blade 402 to access the underside of the substrate 104 when seated on the substrate support 104. The notch 304 is configured to permit the blade 402 to extend through the notch 304 without the blade 402 or substrate 140 contacting the substrate support 104. Alternatively, the blade 402 may pass clearly over the lip 314 of the substrate support 104.

The actuators 122 (two are shown) are energized uniformly to raise the stator 118 while maintaining a substantially perpendicular orientation of the stator 118 relative to the central axis 142. The substrate support 104, which is magnetically coupled to the stator 118, is correspondingly maintained in a perpendicular orientation to the central axis 142 as well. As the substrate support 104 moves closer to the top 112 of the chamber body 102, the substrate 140 is lifted from the blade 402 by the substrate support 104 as shown in FIG. 4B. The blade 402 may then be retracted from the processing chamber 100 and into the transfer chamber 404 through the access port 148. A slit valve 408 is actuated to seal the access port 148 and processing of the substrate may begin. Accordingly, the substrate 140 may be removed from the process chamber 100 by reversing the above described procedure in a similar fashion. As this process for transferring substrates between the blade 402 and the substrate support 104 is facilitated without the use of lift pins typically utilized in conventional RTP chambers, a source of particular generation and potential substrate scratching is advantageously eliminated.

A method for supporting the substrate 140 on the substrate support 104 is stored in the memory 142 of the controller 124, typically as a software routine. The software routine may also be stored and/or executed by a second CPU (not shown) that is remotely located from the hardware being controlled by the CPU 130.

Figure 5:
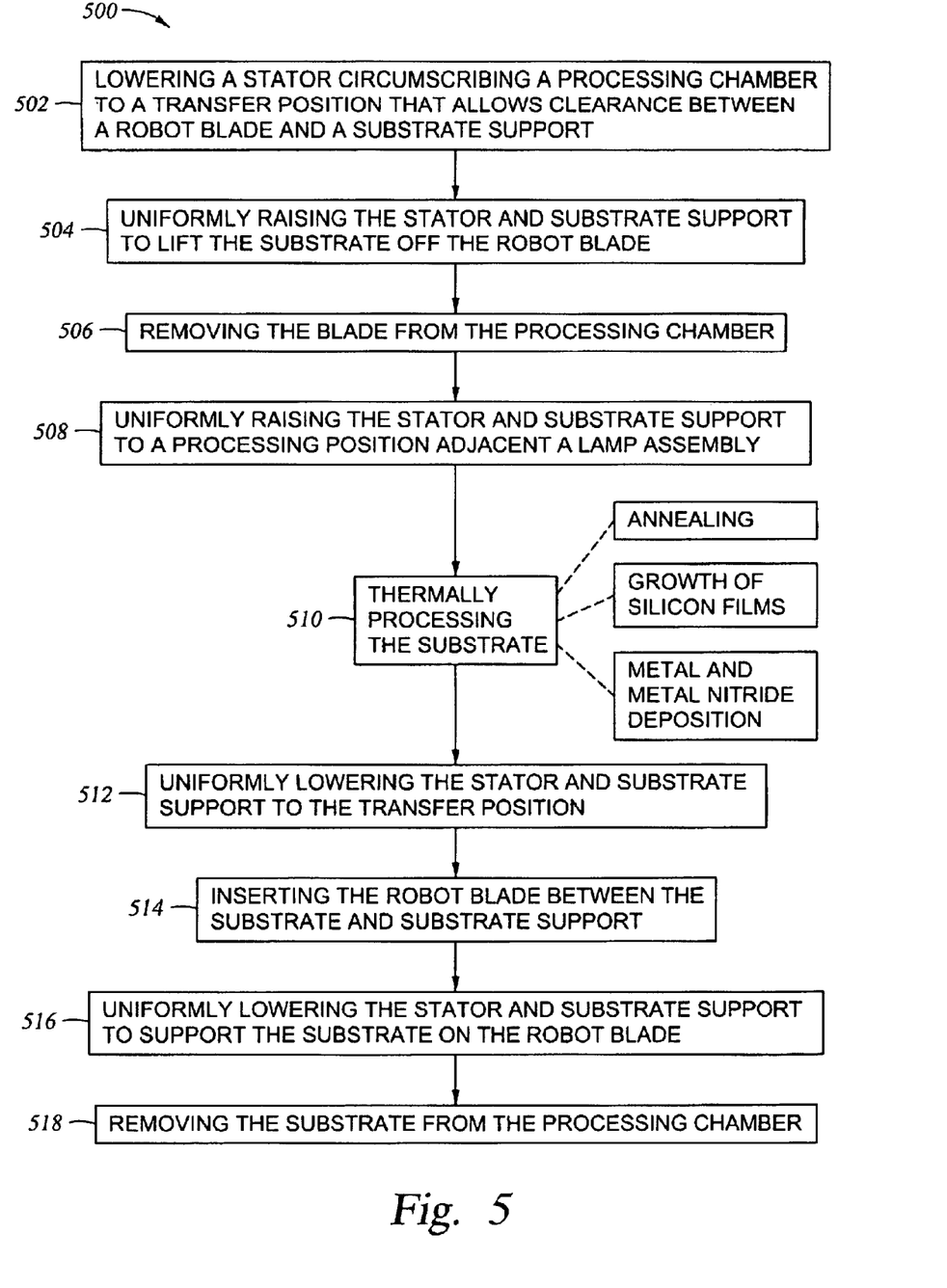
FIG. 5 is a flow diagram of one embodiment of a method for processing a substrate.

One embodiment of a method 500 for supporting a substrate is discussed primarily with respect to FIG. 5. The method 500, when executed by the CPU 124, allows the controller 140 to control the position of the substrate support 104 within the processing chamber 100 so that a thermal or other process may be performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

In one embodiment, the method 500 begins by lowering the stator 118 to a position that allows the blade 402 of the transfer robot carrying the substrate 140 to pass above of the substrate support 104 or through the notch 304 at step 502. At step 504, the actuators 122 uniformly raise the stator 118 and substrate support 104 to lifts the substrate off the blade 402 without the substrate support 104 contacting the blade 402. At step 506, the blade 402 is retracted from the processing chamber 100 and the slit valve 408 closed. At step 508, the actuators 122 uniformly raise the stator 118 and substrate support 104 to a processing position adjacent the lamp assembly 106. Step 508 may include adjusting the chamber pressure utilizing the atmosphere control system 166. Alternatively, the step 506 of lifting the substrate 104 may place the substrate in the processing position.

At step 510, one example of a thermal process is performed. The thermal process may include radiantly heating the substrate to a determined temperature, for example, above about 1000 degrees Celsius for a short duration. Other thermal processes include, but are not limited to, deposition or growth of epitaxial silicon or silicon nitride films, deposition of metals and metal nitrides such as tungsten, tungsten nitride, titanium and titanium nitrides. The atmosphere control system 164 typically provides deposition gases to the processing chamber 100 while controlling chamber pressure during deposition processes. Step 510 may include sequentially energizing the coils 152 to rotate the substrate support 104 and substrate 140.

After processing, step 512 energizes the actuators 122 to uniformly lower the stator 118 and substrate support 104 to a position where the blade 104 may pass between the substrate 140 and substrate support 104. At step 514, the slit valve 408 is opened and the blade 402 is inserted between the substrate 140 and substrate support 104. At step 516, the actuators 112 uniformly lower the stator 118 and substrate support 104 to a position where substrate 140 is supported by the blade 104 and clear of the substrate support 104. At step 518, the blade 402 carrying substrate 140 is retracted from the processing chamber 100.

Figure 6:
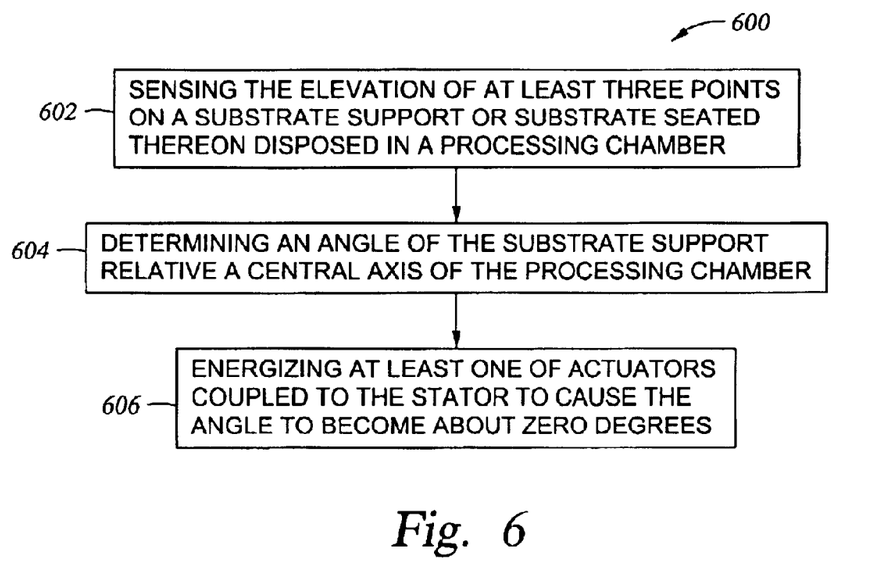
FIG. 6 is a flow diagram of one embodiment of a method for correcting an orientation of a substrate.

FIG. 6 depicts another method 600 for supporting a substrate that may be performed independent, during or between any step of the method 500. The method 600 begins at step 602 where the sensors 116 provide the controller 124 with positional information of at least three points on the substrate support 104 (or substrate seated thereon). At step 604, the controller 124, using the positional information, determines the angle 156 of the substrate support 104 relative the central axis 144. At step 606, the controller 124 energizes at least one of the actuators 122 to change the angle 156 to about zero degrees, i.e., the actuators 122 are energized to orientate the plane 144 of the substrate support 104 substantially perpendicular to the central axis 142. The method 600 thereby ensures the planar orientation of the substrate 140 seated on the substrate support 104 is maintained parallel to the top 112 of the chamber body 102 and perpendicular to the central axis 144, beneficially reducing potential substrate or equipment damage during substrate transfer while enhancing substrate temperature uniformity during thermal processing.

The magnetic coupling of the substrate support to the stator allows the substrate support to be supported and moved within the processing chamber without particle generating contact between the substrate support and other chamber components. Moreover, the actuators coupled to the stator allow the elevation and/or angular orientation of the substrate support to be advantageously controlled, thereby minimizing potential substrate damage and improving processing uniformity.

While the foregoing is directed to the preferred embodiment of the present invention, other and further embodiments of the invention may be devised without departing from the basic scope thereof. The scope of the invention is determined by the claims that follow.

What is claimed is:

1. Apparatus for supporting a substrate, comprising:
   a substrate, support;
   a stator circumscribing and magnetically coupled to the substrate support, wherein the substrate support is rotatable relative to the stator; and
   an actuator coupled to the stator and adapted to move the stator.

2. The apparatus of claim 1 further comprising:
   a second actuator coupled to the stator; and
   a third actuator coupled to the stator, the first, second and third actuators arranged in a spaced-apart relationship.

3. The apparatus of claim 1, wherein the first actuator is an electric control motor, a stepper motor, a servo motor, a pneumatic cylinder, a hydraulic cylinder, a bail screw, a solenoid, a linear actuator, or a cam and follower.

4. The apparatus of claim 1, wherein the first actuator is coupled to the stator by a coupling that allows relative movement between the first actuator and the stator.

5. The apparatus of claim 4, wherein the coupling provides motion along a first axis and a second axis that is orientated perpendicular to the first axis.

6. The apparatus of claim 1 further comprising a thermally reflective plate coupled to the substrate support.

7. The apparatus of claim 1, wherein the substrate support further comprises:
   a support section having a support surface adapted to support the substrate; and
   at least one post protruding from the support surface and defining at least one notch that extends into the support section.

8. The apparatus of claim 7, wherein the substrate support further comprises:
   an annular magnetic section coupled to the support section.

9. The apparatus of claim 8, wherein the magnetic section further comprises:
   a plurality of outwardly extending flanges disposed in a polar army about a centerline of the substrate support.

10. Apparatus for supporting a substrate, comprising:
    an annular substrate support having a central axis;
    a stator circumscribing and magnetically coupled to the substrate support, wherein the substrate support is rotatable relative to the stator;
    a first actuator coupled to the stator, the first actuator adapted to move the stator along or change the angular orientation of the stator relative to the central axis;
    a second actuator coupled to the stator; and
    a third actuator coupled to the stator the first, second and third actuators arranged in a spaced-apart relationship.

11. The apparatus of claim 10, wherein the first actuator is an electric control motor, a stepper motor, a servo motor, a pneumatic cylinder, a hydraulic cylinder, a ball screw, a solenoid, a linear actuator, or a cam and follower.

12. The apparatus of claim 10, wherein the first actuator is coupled to the stator by a coupling that allows relative movement between the first actuator and the stator.

13. The apparatus of claim 12, wherein the coupling provides motion along a first axis and a second axis that is orientated perpendicular to the first axis.

14. The apparatus of claim 10 further comprising a thermally reflective plate coupled to the substrate support.

15. The apparatus of claim 10, wherein the substrate support further comprises:
    a substrate support section having a support surface adapted to support the substrate; and
    at least one post protruding from the support surface and defining at least one notch that extends into the substrate support section.

16. The apparatus of claim 15, wherein the substrate support further comprises:
    an annular magnetic portion coupled to the support section; and
    a plurality of flanges extending radially outward from the magnetic portion in a polar array about a centerline of the substrate support.

17. The apparatus of claim 15, wherein the flanges are permanent magnets.

18. A processing chamber comprising:
    a chamber body defining an interior volume,
    a substrate support disposed in the interior volume of the chamber body;
    a stator circumscribing the chamber body and magnetically coupled to the substrate support, wherein the substrate support is rotatable relative to the stator; and an actuator coupled to the stator and adapted to move the stator.

19. The chamber of claim 18 further comprising:
a second actuator coupled to the stator; and
a third actuator coupled to the stator, the first, second and third actuators arranged in a spaced-apart relationship.

20. The chamber of claim 18 further comprising:
a lamp assembly coupled to a top of the chamber body and adapted to heat the interior volume of the chamber body.

21. The chamber of claim 18 further comprising:
an atmosphere control system coupled to the chamber body and adapted to provide deposition gases to the interior volume of the chamber body.

22. The apparatus of claim 1, wherein the substrate support further comprises:
a plurality of permanent magnets arranged to impart rotational motion to the substrate support in response o an energization state of the stator.

23. The apparatus of claim 10, wherein the substrate support further comprises:
a plurality of permanent magnet arranged to impart rotational motion to the substrate support in response to an energization state of the stator.

24. The apparatus of claim 18, wherein the substrate support further comprises:
a plurality of permanent magnets arranged to impart rotational motion to the substrate support in response to an energization state of the stator.

25. The apparatus of claim 10, wherein the change in angular orientation of the central axis of the substrate support corresponds to relative extensions of the first, second and third actuators.

26. The apparatus of claim 1, wherein the substrate support has a first planar orientation corresponding to a first actuator position and a second planar orientation corresponding to a second actuator position, wherein the first planar orientation is non-parallel to the second planar orientation.

27. The apparatus of claim 10, wherein the substrate support has a first planar orientation corresponding to a first actuator position, and a second planar orientation corresponding to a second, actuator position, wherein the first planar orientation is non-parallel to the second planar orientation.

* * * * *

UNITED STATES PATENT AND TRADEMARK OFFICE
CERTIFICATE OF CORRECTION

PATENT NO. : 6,800,833 B2
APPLICATION NO. : 10/114014
DATED : October 5, 2004
INVENTOR(S) : Gregor et al.

It is certified that error appears in the above-identified patent and that said Letters Patent is hereby corrected as shown below:

On the Title Page, Item (74), under "Attorney, Agent, or Firm", in column 2, lines 1-2, delete "Moser Patterson Sheridan LLC" and insert -- Moser, Patterson & Sheridan, LLP --, therefor.

In column 9, line 50, in Claim 1, after "substrate" delete ",".

In column 9, line 63, in claim 3, delete "bail" and insert -- ball --, therefor.

In column 10, line 20, in Claim 9, delete "army" and insert -- array --, therefor.

In column 10, line 30, in Claim 10, after "stator" insert -- , --.

In column 11, line 19, in Claim 22, delete "o" and insert -- to --, therefor.

In column 11, line 23, in Claim 23, delete "magnet" and insert -- magnets --, therefor.

In column 12, line 20, in Claim 27, after "position" delete ",".

In column 12, line 21, in Claim 27, after "second" delete ",".

Signed and Sealed this

Nineteenth Day of June, 2007

JON W. DUDAS
*Director of the United States Patent and Trademark Office*